US010860923B2

(12) United States Patent
Obradovic et al.

(10) Patent No.: US 10,860,923 B2
(45) Date of Patent: Dec. 8, 2020

(54) HIGH-DENSITY NEUROMORPHIC COMPUTING ELEMENT

(71) Applicant: Samsung Electronics Co., Ltd., Suwon-si, Gyeonggi-do (KR)

(72) Inventors: Borna J. Obradovic, Leander, TX (US); Titash Rakshit, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 813 days.

(21) Appl. No.: 15/488,419

(22) Filed: Apr. 14, 2017

(65) Prior Publication Data

US 2018/0174034 A1 Jun. 21, 2018

Related U.S. Application Data

(60) Provisional application No. 62/437,016, filed on Dec. 20, 2016.

(51) Int. Cl.
| | | |
|---|---|---|
| *G06N 3/063* | (2006.01) | |
| *H01L 29/808* | (2006.01) | |
| *H01L 27/11521* | (2017.01) | |
| *H01L 29/66* | (2006.01) | |
| *H01L 29/788* | (2006.01) | |
| *H01L 29/423* | (2006.01) | |
| *H01L 21/28* | (2006.01) | |

(52) U.S. Cl.
CPC ...... *G06N 3/0635* (2013.01); *H01L 27/11521* (2013.01); *H01L 29/40114* (2019.08); *H01L 29/42324* (2013.01); *H01L 29/66825* (2013.01); *H01L 29/7881* (2013.01); *H01L 29/8083* (2013.01)

(58) Field of Classification Search
CPC ............ G06N 3/0635; H01L 29/40114; H01L 29/42324; H01L 29/7881; H01L 29/8083
See application file for complete search history.

(56) References Cited

U.S. PATENT DOCUMENTS

| | | | |
|---|---|---|---|
| 5,336,937 A | 8/1994 | Sridhar et al. | |
| 5,874,760 A | 2/1999 | Burns, Jr. et al. | |
| 5,973,352 A * | 10/1999 | Noble | H01L 27/115 257/315 |
| 7,486,555 B2 | 2/2009 | Harari | |
| 8,437,192 B2 | 5/2013 | Lung et al. | |
| 8,773,881 B2 | 7/2014 | Shepard | |
| 8,971,118 B2 | 3/2015 | Jin et al. | |
| 9,520,501 B2 | 12/2016 | Koldiaev et al. | |

(Continued)

*Primary Examiner* — Robert A Cassity
*Assistant Examiner* — Tsu-Chang Lee
(74) *Attorney, Agent, or Firm* — Lewis Roca Rothgerber Christie LLP

(57) ABSTRACT

A neuromorphic device for the analog computation of a linear combination of input signals, for use, for example, in an artificial neuron. The neuromorphic device provides non-volatile programming of the weights, and fast evaluation and programming, and is suitable for fabrication at high density as part of a plurality of neuromorphic devices. The neuromorphic device is implemented as a vertical stack of flash-like cells with a common control gate contact and individually contacted source-drain (SD) regions. The vertical stacking of the cells enables efficient use of layout resources.

7 Claims, 18 Drawing Sheets

(56) References Cited

U.S. PATENT DOCUMENTS

| | | | |
|---|---|---|---|
| 2009/0310425 A1* | 12/2009 | Sim | H01L 27/1157 365/185.29 |
| 2014/0151774 A1 | 6/2014 | Rhie | |
| 2014/0175529 A1* | 6/2014 | Park | H01L 27/11521 257/316 |
| 2015/0324691 A1 | 11/2015 | Dropps et al. | |
| 2016/0284400 A1 | 9/2016 | Yakopcic et al. | |
| 2018/0269229 A1* | 9/2018 | Or-Bach | H01L 29/40117 |

* cited by examiner

HIGH-DENSITY NEUROMORPHIC COMPUTING ELEMENT

CROSS-REFERENCE TO RELATED APPLICATION(S)

The present application claims priority to and the benefit of U.S. Provisional Application No. 62/437,016, filed Dec. 20, 2016, entitled "HIGH-DENSITY NEUROMORPHIC MEMORY CELL", the entire content of which is incorporated herein by reference.

FIELD

One or more aspects of embodiments according to the present invention relate to neural networks, and more particularly to a neuromorphic device suitable for use in an artificial neuron.

BACKGROUND

Neural networks may be used for pattern recognition, classification, language processing, artificial intelligence and other applications. A neural network may be implemented either in software (on a central processing unit (CPU) or on a graphics processing unit (GPU)), or in dedicated complementary metal oxide semiconductor (CMOS) processors, which may be similar to GPUs. In each case the underlying technology used may be digital CMOS, which may result in a complex and inefficient implementation of the artificial neuron. For example, for a neural network implemented in software running on a generic CMOS processor, each neuron may perform n floating-point multiplications (n being the number of inputs), a floating-point addition, and a non-linear thresholding function.

Thus, there is a need for a more efficient system implementation of a neural network.

SUMMARY

Aspects of embodiments of the present disclosure are directed toward a neuromorphic device for the analog computation of a linear combination of input signals, for use, for example, in an artificial neuron. The neuromorphic device provides non-volatile programming of the weights, and fast evaluation and programming, and is suitable for fabrication at high density as part of a plurality of neuromorphic devices. The neuromorphic device is implemented as a vertical stack of flash-like cells with a common control gate contact and individually contacted source-drain (SD) regions. The vertical stacking of the cells enables efficient use of layout resources.

According to an embodiment of the present invention there is provided a neuromorphic device, including: a substrate, the substrate being substantially planar, a first floating-gate transistor on the substrate, the first floating-gate transistor having: a channel; a floating gate; and a control gate; and a second floating-gate transistor, vertically stacked on the first floating-gate transistor, the second floating-gate transistor having: a channel; a floating gate; and a control gate directly connected to the control gate of the first floating-gate transistor, the neuromorphic device having: a gate contact connected to: the control gate of the first floating-gate transistor, and the control gate of the second floating-gate transistor, a first source-drain contact connected to a first end of the channel of the first floating-gate transistor a second source-drain contact connected to a second end, opposite the first end, of the channel of the first floating-gate transistor and to a first end of the channel of the second floating-gate transistor, and a third source-drain contact connected to a second end of the channel of the second floating-gate transistor.

In one embodiment, the channel of the first floating-gate transistor and the channel of the second floating-gate transistor are parts of one continuous, vertical structure.

In one embodiment, the neuromorphic device includes the first floating-gate transistor and the second floating-gate transistor, and a second number of source-drain contacts, including the first source-drain contact, the second source-drain contact, and the third source-drain contact, the second number being greater than the first number by one.

In one embodiment, the neuromorphic device includes sixteen floating-gate transistors including the first floating-gate transistor and the second floating-gate transistor.

In one embodiment, the neuromorphic device includes thirty-two floating-gate transistors including the first floating-gate transistor and the second floating-gate transistor.

In one embodiment, the first source-drain contact includes: a first conductive path; and a second conductive path, the first conductive path being horizontal and having a first length, and the second conductive path being vertical and having a second length, the second source-drain contact includes: a third conductive path; and a fourth conductive path, the third conductive path being horizontal and having a third length less than the first length, and the fourth conductive path being vertical and having a fourth length less than the second length.

In one embodiment, the neuromorphic device includes: an internal sidewall spacer in the gate contact opening, to insulate the gate contact from the horizontal portion of the first source-drain contact; and an internal sidewall spacer in the gate contact opening, to insulate the gate contact from the horizontal portion of the second source-drain contact.

According to an embodiment of the present invention there is provided a method for operating a neural network, the method including: erasing a neuromorphic device, the neuromorphic device including: a substrate, the substrate being substantially planar, a first floating-gate transistor on the substrate, the first floating-gate transistor having: a channel; a floating gate; and a control gate; and a second floating-gate transistor, vertically stacked on the first floating-gate transistor, the second floating-gate transistor having: a channel; a floating gate; and a control gate directly connected to the control gate of the first floating-gate transistor, the neuromorphic device having: a gate contact connected to: the control gate of the first floating-gate transistor, and the control gate of the second floating-gate transistor; a first source-drain contact connected to a first end of the channel of the first floating-gate transistor a second source-drain contact connected to a second end of the channel of the first floating-gate transistor and to a first end of the channel of the second floating-gate transistor, and a third source-drain contact connected to a second end of the channel of the second floating-gate transistor, the erasing including: applying, during a first time interval a first voltage to the gate contact; and applying, during the first time interval, a second voltage, higher than the first voltage, to: the first source-drain contact; the second source-drain contact; and the third source-drain contact.

In one embodiment, the first time interval is sufficiently long and the second voltage is sufficiently higher than the first voltage to cause each of a threshold voltage of the first floating-gate transistor, and a threshold voltage of the second floating-gate transistor to be less than 0.5 V.

In one embodiment, the method includes the first floating-gate transistor and the second floating-gate transistor, and has a plurality of source-drain contacts, including the first source-drain contact, the second source-drain contact, and the third source-drain contact, the method further including programming the neuromorphic device, the programming including: applying a third voltage to: a first set of consecutive source-drain contacts of the plurality of source-drain contacts; and the gate contact; and applying a fourth voltage to a second set of consecutive source-drain contacts of the plurality of source-drain contacts, the first set of consecutive source-drain contacts and the second set of consecutive source-drain contacts: being mutually exclusive subsets of the plurality of source-drain contacts, and together including all of the plurality of source-drain contacts.

In one embodiment, the third voltage is selected from among a set of 256 voltages.

In one embodiment, the third voltage is selected from among a set of four voltages.

In one embodiment, the method includes evaluating the neuromorphic device, the evaluating including: applying a third voltage to the gate contact, the third voltage being selected to cause each of the first floating-gate transistor and the second floating-gate transistor to operate in a linear mode; applying a first input voltage to the first source-drain contact; applying a second input voltage to the second source-drain contact; and processing a voltage at the third source-drain contact with a thresholding circuit, the thresholding circuit being a circuit configured to receive, as an input, the voltage at the third source-drain contact and to generate an output voltage, the output voltage being a nonlinear function of the voltage at the third source-drain contact.

In one embodiment, the thresholding circuit is configured to generate, as the output voltage, a voltage selected from among a set of 256 voltages.

In one embodiment, the thresholding circuit is configured to generate, as the output voltage, a voltage selected from among a set of four voltages.

According to an embodiment of the present invention there is provided a method for fabricating a neuromorphic device, the method including: forming, on a substrate, a first floating-gate transistor, the first floating-gate transistor having: a channel; a floating gate; and a control gate; and forming a second floating-gate transistor, vertically stacked on the first floating-gate transistor, the second floating-gate transistor having: a channel; a floating gate; and a control gate directly connected to the control gate of the first floating-gate transistor, the forming of the second floating-gate transistor and of the first floating-gate transistor including: forming a gate contact connected to: the control gate of the first floating-gate transistor, and the control gate of the second floating-gate transistor; forming a first source-drain contact connected to a first end of the channel of the first floating-gate transistor, forming a second source-drain contact connected to a second end of the channel of the first floating-gate transistor and to a first end of the channel of the second floating-gate transistor, and forming a third source-drain contact connected to a second end of the channel of the second floating-gate transistor.

In one embodiment, the forming of the gate contact includes forming a gate contact opening penetrating: a horizontal portion of the first source-drain contact; and a horizontal portion of the second source-drain contact.

In one embodiment, the forming of the gate contact further includes: forming an internal sidewall spacer in the gate contact opening, to insulate the gate contact from the horizontal portion of the first source-drain contact; and forming an internal sidewall spacer in the gate contact opening, to insulate the gate contact from the horizontal portion of the second source-drain contact.

In one embodiment, the forming of the gate contact further includes filling the gate contact opening with contact metal.

In one embodiment, the forming of the first source-drain contact and the first source-drain contact includes: forming a first source-drain contact opening extending to the horizontal portion of the first source-drain contact; forming a second source-drain contact opening extending to the horizontal portion of the second source-drain contact; and filling the first source-drain contact opening and the second source-drain contact opening with contact metal.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a high-density neuromorphic memory device provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
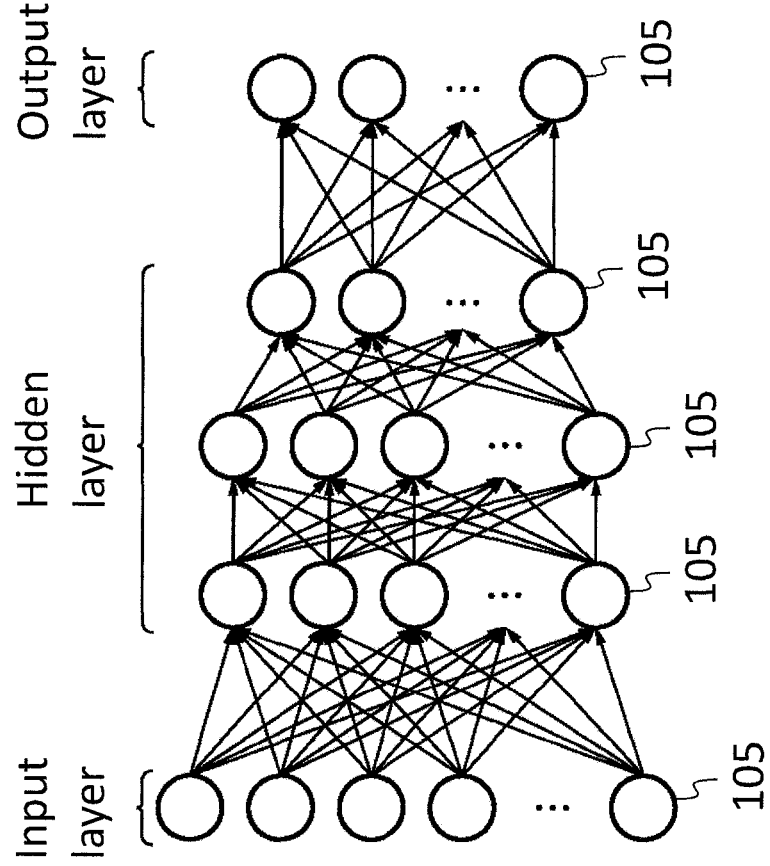
FIG. 1A is a diagram of a neural network, according to an embodiment of the present invention.
Figure 1B:
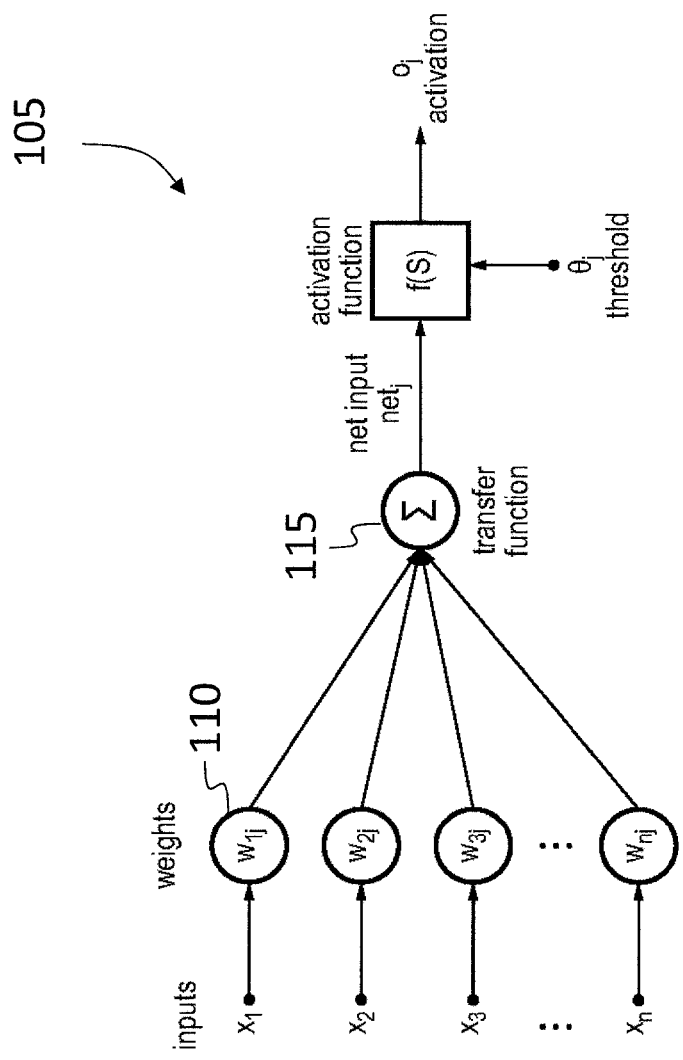
FIG. 1B is a diagram of an artificial neuron, according to an embodiment of the present invention.

FIG. 1A shows a neural network, according to one embodiment. The neural network includes a plurality of artificial neurons 105. The artificial neurons form an input layer, a hidden layer (including one or more sub-layers), and an output layer, with a plurality of connections between the artificial neurons, as illustrated, for example. FIG. 1B shows an artificial neuron 105 in one embodiment. A weighted sum (or "linear combination") of the inputs is formed (i.e., each input is multiplied by a respective weight 110, and the sum 115 of these products is firmed), and the weighted sum is processed by an activation function f(S), which may be a nonlinear thresholding function.

Some embodiments provide a compact implementation of an analog (or nearly analog) artificial neuron, based on a set of flash-like cells as analog storage elements. The use of analog memory to represent artificial neurons may reduce the circuit complexity required to perform the multiply, add, threshold sequence required for neural network (NN) computations. Computations performed by each artificial neuron may include forming a linear combination of a possibly large number of inputs, followed by non-linear thresholding, performed by a circuit referred to herein as a "thresholding circuit". In some embodiments, the evaluation of the linear combination of inputs is performed as an analog addition of weighted input voltages (as opposed to performing floating-point operations with digitally-represented quantities). The weights applied to each input are represented by the charge state in the floating gate of each flash-like cell. The charge state in turn sets the threshold voltage (Vt) of the cell. The evaluation is performed with all cells in the linear regime, so that the output voltage is a linear combination of inputs, weighted by a value depending on the resistance state of each cell. The computation of each artificial neuron output may therefore be performed in a matter of nanoseconds with a small number of devices, as opposed to the multiple thousands of transistors and multiple clock cycles that may be required to implement the linear combination of digital floating-point numbers in standard CMOS. As used herein, an artificial neuron is any structure that operates in a manner analogous to that of a neuron, and a neuromorphic device (e.g., a neuromorphic memory device) is any electronic structure that behaves as (or as part of) an artificial neuron.

Figure 2:
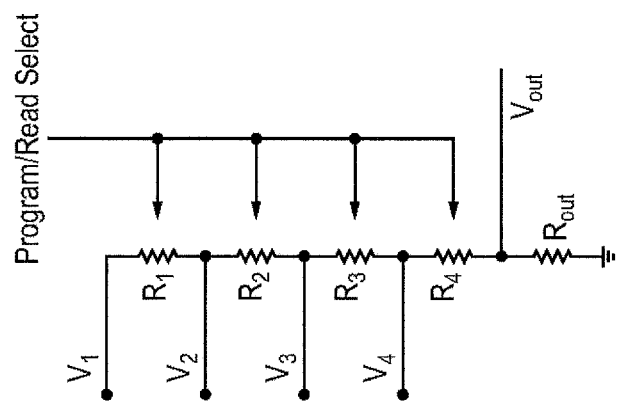
FIG. 2 is a notional schematic diagram of a neuromorphic device, according to an embodiment of the present invention.

Referring to FIG. 2, in some embodiments a neuromorphic device may be represented by the equivalent circuit shown. A resistive divider produces an output voltage $V_{out}$ that is a linear combination of the input voltage $V_1$, $V_2$, $V_3$, and $V_4$. For example, the first weight (by which $V_1$ is multiplied to form the linear combination) is $R_{out}/(R_1+R_2+R_3+R_4+R_{out})$, the second weight (by which V2 is multiplied to form the linear combination) is $R_{out}/(R_2+R_3+R_4+R_{out})$, and so forth. If the resistors $R_1$, $R_2$, $R_3$, and $R_4$ are programmable, then the linear combination is programmable, making the neuromorphic device suitable for use in an artificial neuron, for forming a linear combination.

Figure 3A:
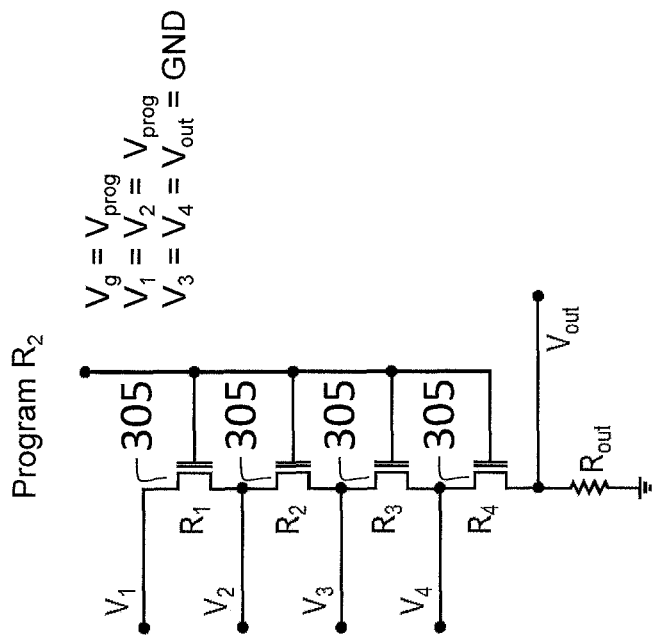
FIG. 3A is a schematic diagram of a neuromorphic device, according to an embodiment of the present invention.

Referring to FIG. 3A, in some embodiments, flash-like cells 305 may be used as programmable resistors in a neuromorphic device, as shown. Each cell 305 may include (e.g., consist of) a floating-gate transistor having a floating gate and a control gate. Each cell 305 may be individually programmed using an appropriate combination of inputs. The control gates of all cells may be connected to be at a common (high) voltage. To program a cell, the cell may be selected based on drain inputs. For example, in the circuit of FIG. 3A, to program any one of the cells, a programming voltage $V_{prog}$ (i.e., a voltage suitable for programming the flash-like cells) that is above VDD (the positive supply voltage supplied to the integrated circuit) is applied to the drain of the cell to be programmed and to the drain of each cell above it (if there are any cells above it), and a lower voltage (e.g., ground) is applied to its source and to the source of each cell below it (if there are any cells below it). The voltages ($V_1$, $V_2$, $V_3$, and $V_4$) shown in FIG. 3A (and ground (GND) applied to the $V_{out}$ terminal) may be used to program the cell labeled $R_3$, for example. Conversely, an operating VDD may be chosen which is below the programming voltage. In some embodiments, these voltages, i.e., VDD and the programming voltages, are sufficiently separated (i.e., different) that read-disturbance (the alteration of the programmed states of the cells during evaluation operations) is acceptably small.

Figure 3B:
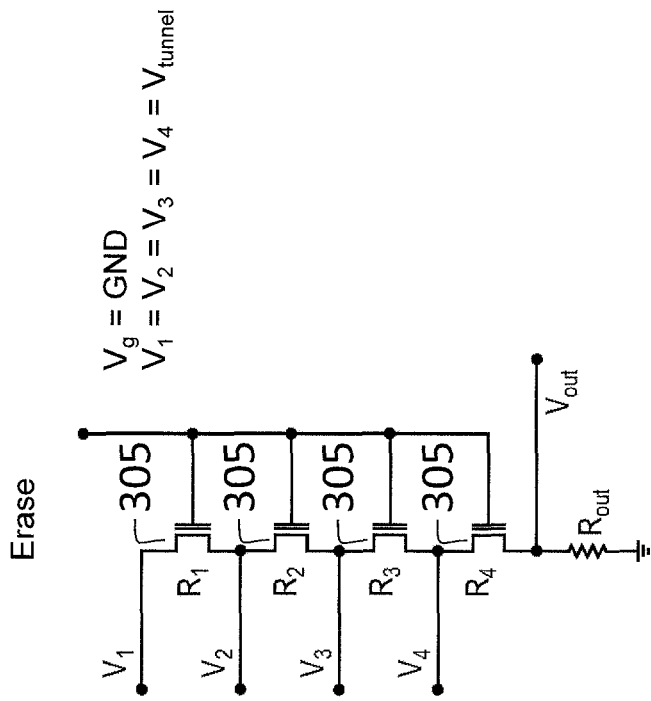
FIG. 3B is a schematic diagram of a neuromorphic device, according to an embodiment of the present invention.

FIG. 3B shows the circuit of FIG. 3A, annotated with voltages that may be used for erasing all of the cells 305 in the neuromorphic device at once. A first voltage (e.g., ground) is applied to all of the control gates, and a second voltage, above VDD, that operates as a tunnel voltage ($V_{tunnel}$) is applied to all of the input terminals and to the output terminal. During the erasure operation electrons move between the control gates and the floating gates, in a direction that reduces the potential difference between the control gates and the floating gates, and tends to equalize the net charge on the floating gates. After erasure is completed, the threshold voltage of each cell 305 is reduced, and its resistance is reduced. A sufficiently high voltage and a sufficiently high erasure time interval may be used that after erasure, the threshold voltage of each of the cells (i.e., the threshold voltage of each of the floating-gate transistors), is much less than $V_{READ}$, where $V_{READ}$ is the voltage applied to the gate during evaluation (as described in further detail below). In some embodiments, after erasure, the threshold voltage of each of the floating-gate transistors is less than 0.5 V.

Figure 3C:
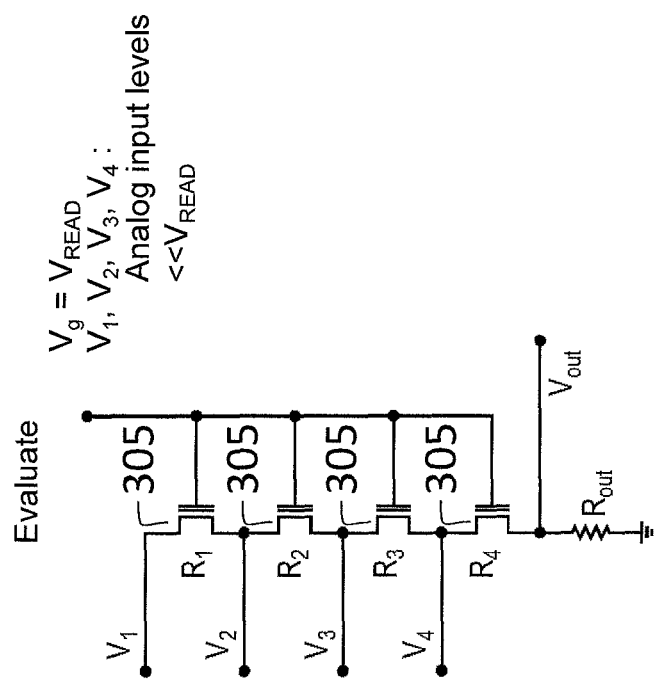
FIG. 3C is a schematic diagram of a neuromorphic device, according to an embodiment of the present invention.

FIG. 3C shows the circuit of FIG. 3A, annotated with voltages that may be used for "evaluating" the neuromorphic device, i.e., forming, at the output of the neuromorphic device, the linear combination of input voltages. Input voltages of $V_1$, $V_2$, $V_3$, $V_4$ are applied to the respective inputs, and a gate voltage $V_{READ}$ is applied to all of the gates, the gate voltage being one that results in all of the cells 305 operating their linear regions, e.g., behaving approximately as resistors, each having a resistance corresponding to the weight with which it was programmed during programming (and corresponding to the charge stored on its floating gate).

In some embodiments the input voltages are analog voltages; in other embodiments, they are discrete analog voltages, i.e., each voltage is selected from a discrete set of voltages (e.g., 4, 16, or 256 discrete voltages), such as the set of voltages that may be produced by a digital to analog converter. The output of the thresholding circuit may be a voltage is selected from a discrete set of voltages; this may result in the inputs of subsequent artificial neurons receiving voltages selected from a discrete set of voltages. The programming voltages also may be selected from a discrete set of voltages (e.g., as a result of being generated by an a digital to analog converter).

The programming operation may result in increasing the threshold voltage of individual flash-like cells, resulting in increased resistance. The programming of each cell is to an analog level, as determined by programming time and voltage. Due to the availability of individual source-drain contacts, programming using hot carrier injection is possible; this programming method may be significantly faster, and use a lower programming voltage, than that employed for vertically-stacked NAND flash memory (VNAND), which may use tunneling programming and erase methods.

Figure 15:
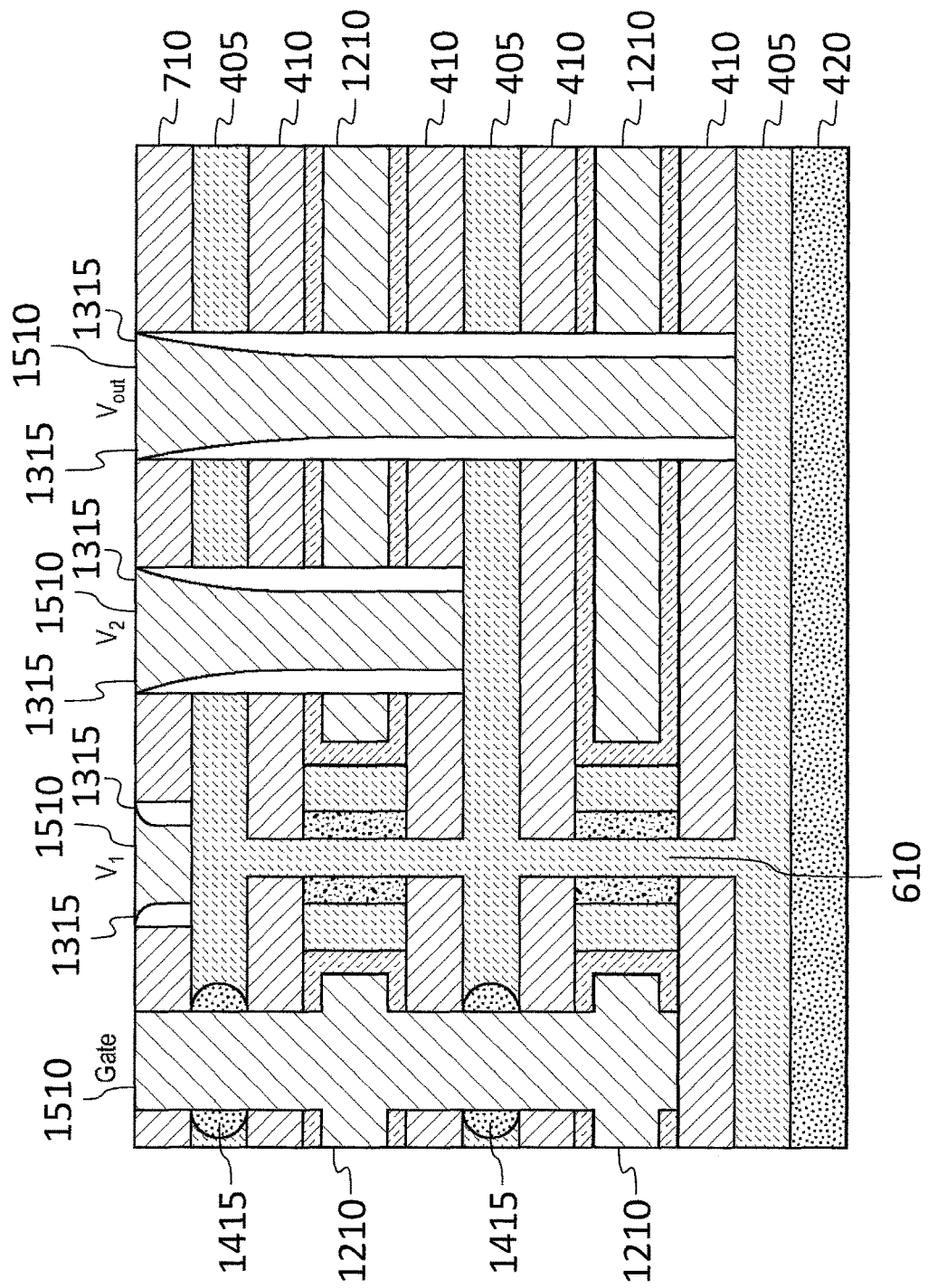
FIG. 15 is a neuromorphic device, according to an embodiment of the present invention.

Referring to FIG. 15, structurally, each neuromorphic device is, in some embodiments, comprised of a vertical stack of flash-like cells, all sharing a common polycrystalline silicon (Si) channel 610 (i.e., the cells are connected in series). The neuromorphic device may be formed on a substantially planar substrate 420 (e.g., an oxide substrate). As used herein, "horizontal" refers to a direction parallel to the substrate, and "vertical" refers to a direction perpendicular to the substrate. The cells of a single neuromorphic device have individually contacted source-drain (SD) areas, but a common control gate contact 1510. The common control gate contact 1510 is realized as a single trench (or "gate contact opening") with metal fill contacting all the control gate layers. The source-drain contact layers 405 (polycrystalline semiconductor, e.g., Si) are insulated from the control gate contact 1510 by internal spacers 1415 (silicon dioxide (SiO2), or a similar insulator may be used). The source-drain contact layers 405 are individually contacted, using a stair-step contact scheme. As used herein, "contact" refers to a conductive path to a terminal (e.g., a source-drain or a gate) of an active device (e.g., a floating-gate transistor). As used herein, a "source-drain" is either end of the channel of a floating-gate transistor.

The number of flash cells stacked vertically is limited only by the capability of the process. Using a larger number of vertical layers enables neuromorphic devices with a larger number of inputs, without requiring additional interconnects. If the vertical stacking is more limited, then cells with a larger number of inputs may be realized as serial combinations of smaller cells, laid out in in a planar manner. In some embodiments the neuromorphic device has 32 layers or more, which may be sufficient for a majority of neural network applications. In addition to reducing the amount of interconnect required, the vertical stacking of cells may significantly reduce the layout footprint. This is a result of the (relatively) long channels used by flash-like cells, especially for analog applications. The gate dielectric used for acceptable charge retention may be significantly thicker than for CMOS digital logic, and the additional floating poly and associated insulators may further degrade the electrostatics of the device. Accordingly the flash-like cell may use a longer channel than may be used for core logic, e.g., the flash-like cell may use a 30 nm-40 nm long channel. Charge retention may be a significant challenge for analog memory, since even small amounts of charge loss can be significant (analog refresh may mitigate charge loss to some extent, but analog refresh may be burdensome). Taking this constraint into account may result in a further increase in the gate dielectric thickness, which may in turn result in even longer channel lengths. These can be accommodated with a vertical stacking arrangement, however.

Figure 4:
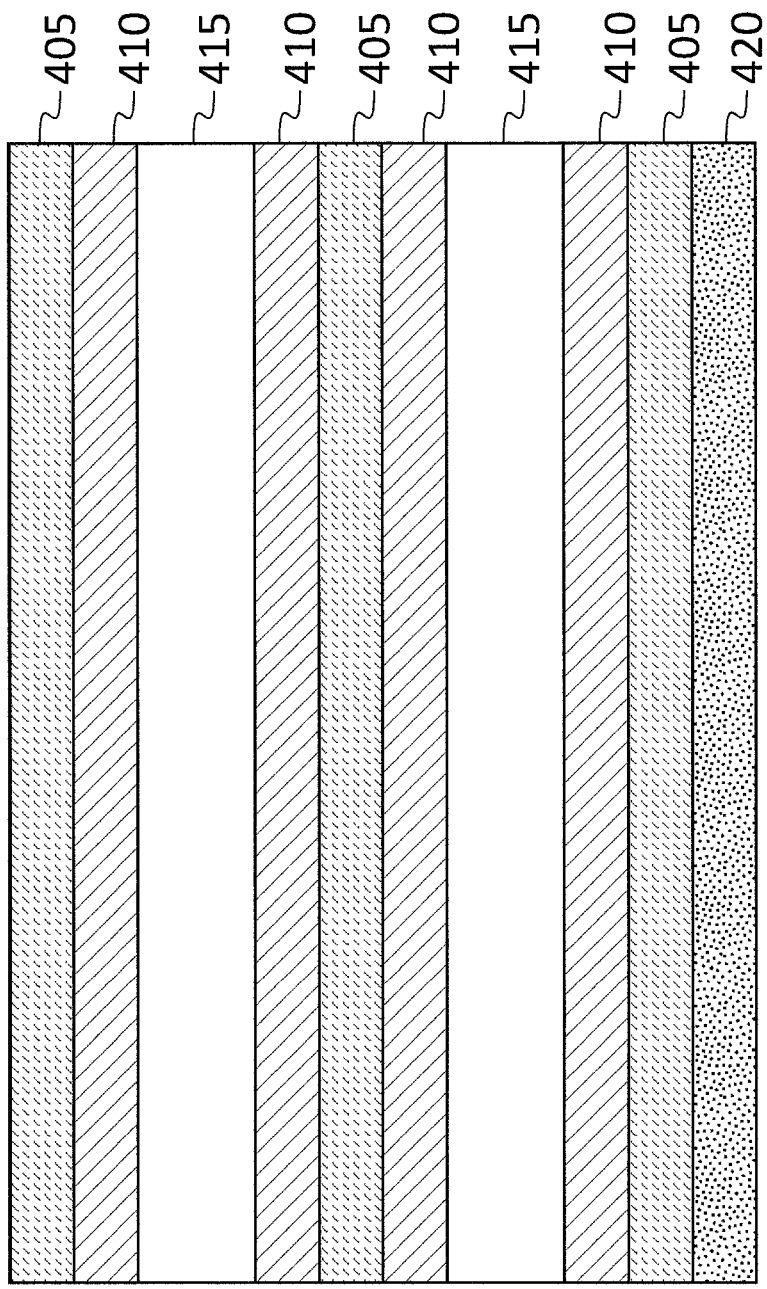
FIG. 4 is an intermediate product in the fabrication process for a neuromorphic device, according to an embodiment of the present invention.

FIG. 4 shows an intermediate product in the fabrication process for a neuromorphic device, according to some embodiments. Three n+ doped polycrystalline silicon layers 405, four spacer layers 410 (composed of silicon dioxide (SiO2) or other spacer material), and two sacrificial gate layers 415 (composed of α-carbon or another insulating material) are formed on an insulating substrate 420. The structure of FIG. 4 may be formed, for example, by forming the layers for a first cell by (i) depositing a first one of the n+ doped polycrystalline silicon layers 405 on the substrate 420, (ii) depositing a first one of the spacer layers 410 on the first one of the n+ doped polycrystalline silicon layers 405, (iii) depositing a first one of the sacrificial gate layers 415 on the first one of the spacer layers 410, and (iv) depositing a second one of the spacer layers 410 on the first one of the sacrificial gate layers 415. These four deposition processes may then be repeated for each cell to be formed in the stack of cells. An additional n+ doped polycrystalline silicon layer 405 may then be formed on top of the stack of layers.

Figure 5:
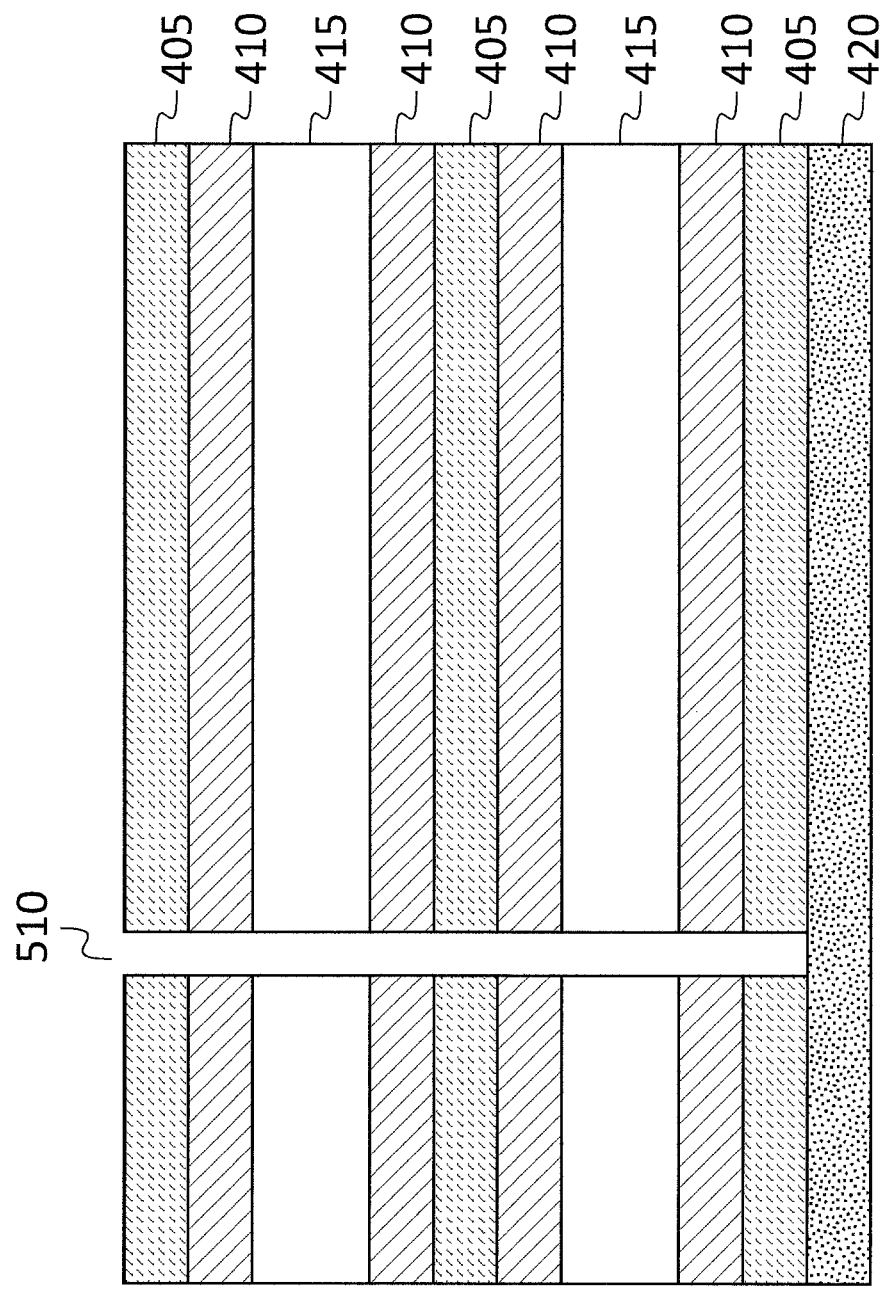
FIG. 5 is an intermediate product in the fabrication process for a neuromorphic device, according to an embodiment of the present invention.
Figure 6:
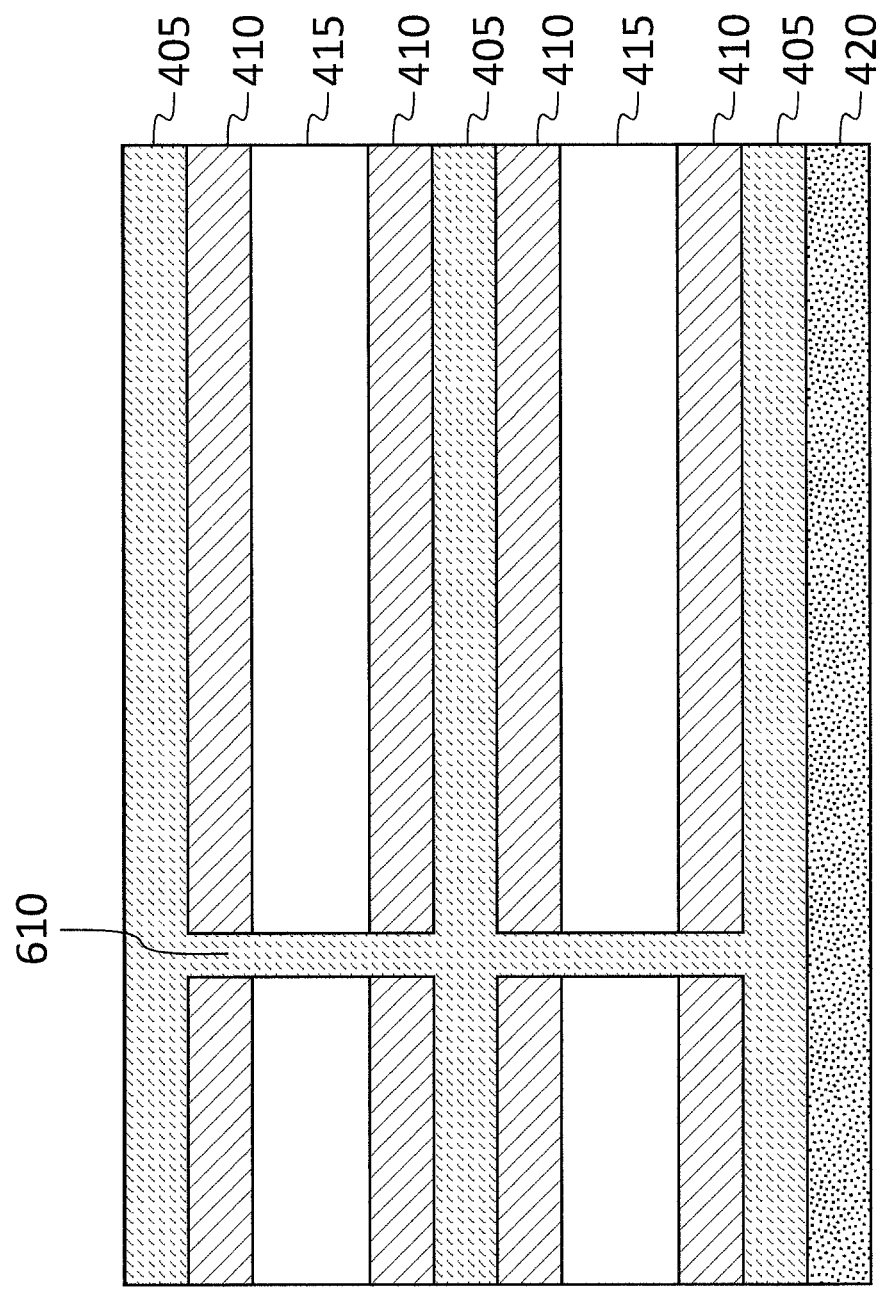
FIG. 6 is an intermediate product in the fabrication process for a neuromorphic device, according to an embodiment of the present invention.
Figure 7:
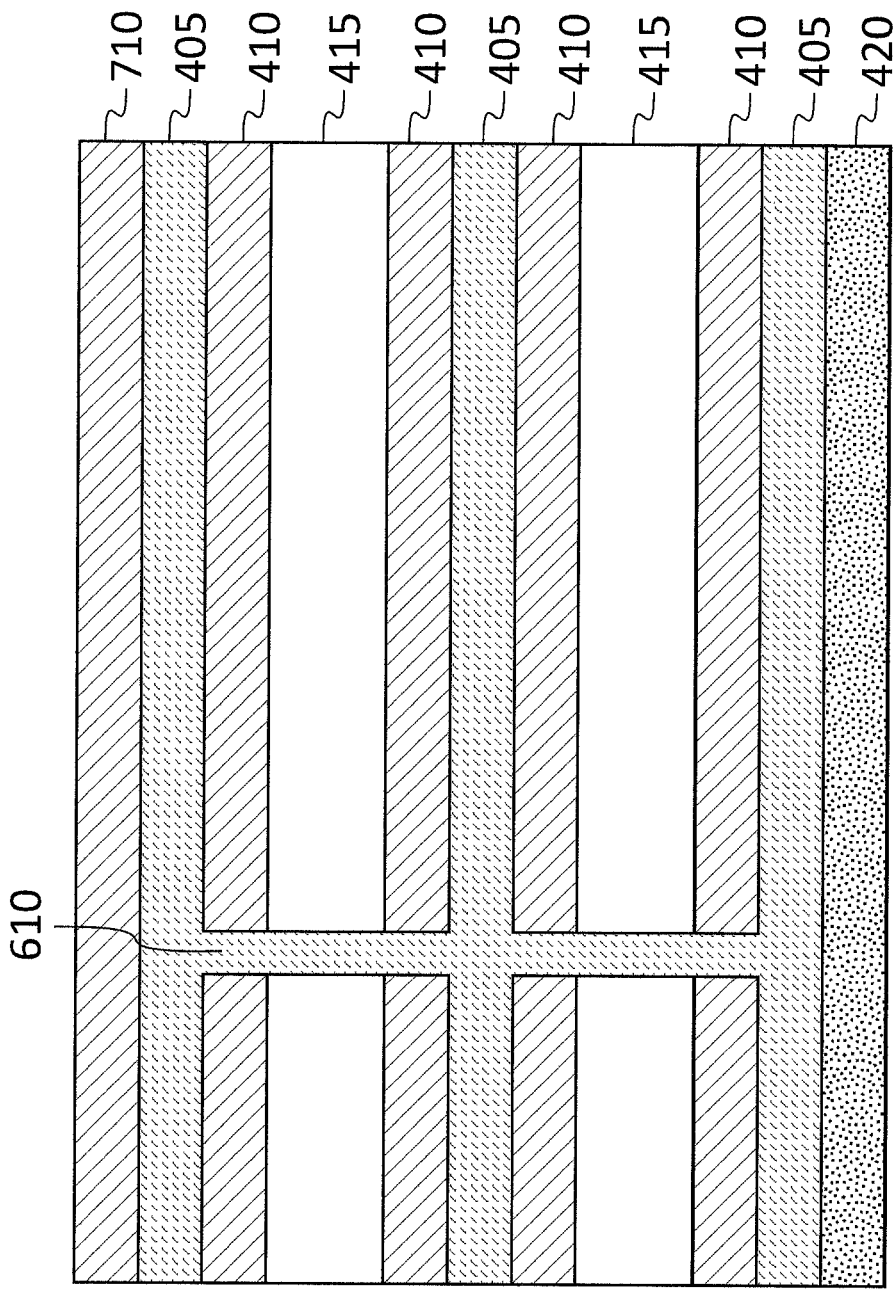
FIG. 7 is an intermediate product in the fabrication process for a neuromorphic device, according to an embodiment of the present invention.
Figure 8:
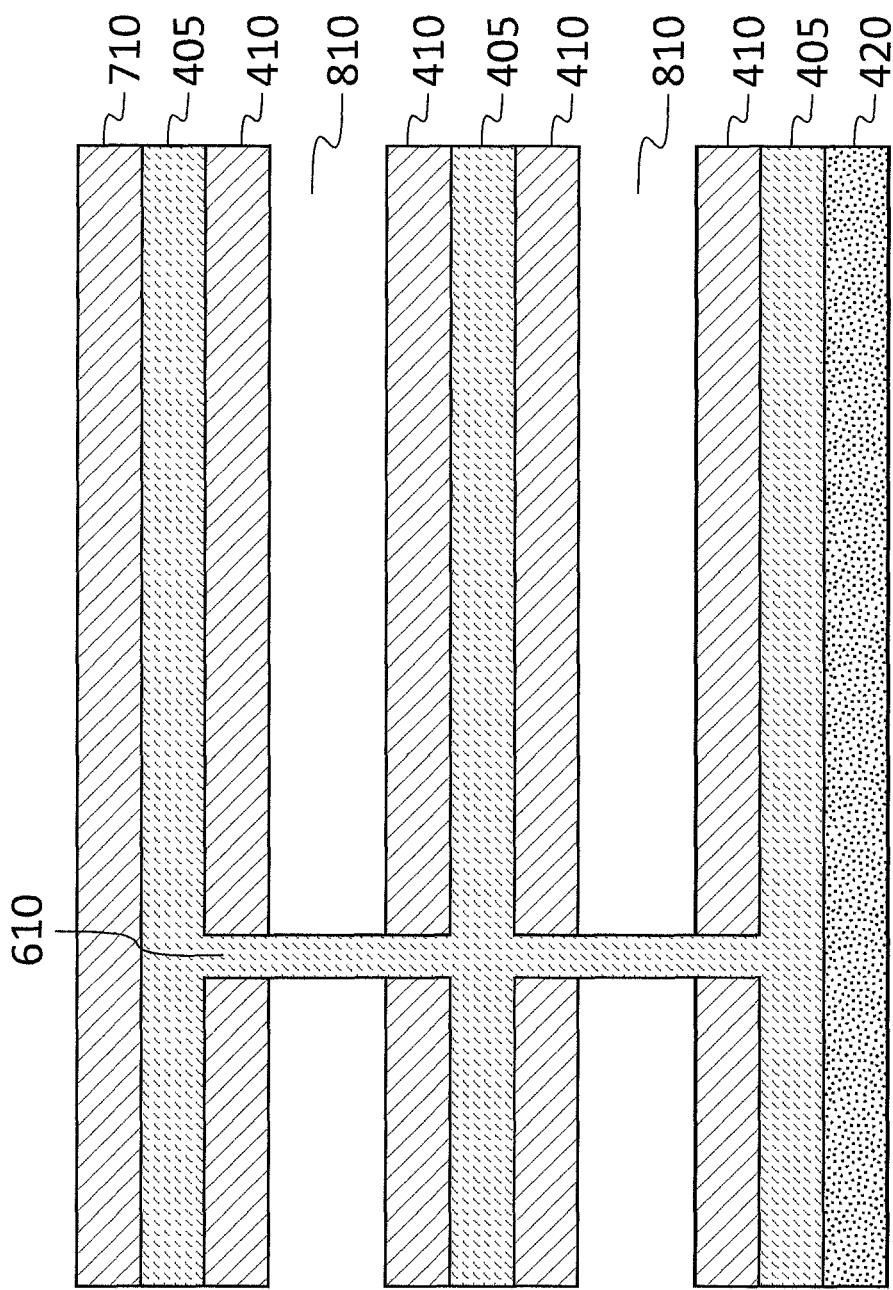
FIG. 8 is an intermediate product in the fabrication process for a neuromorphic device, according to an embodiment of the present invention.
Figure 9:
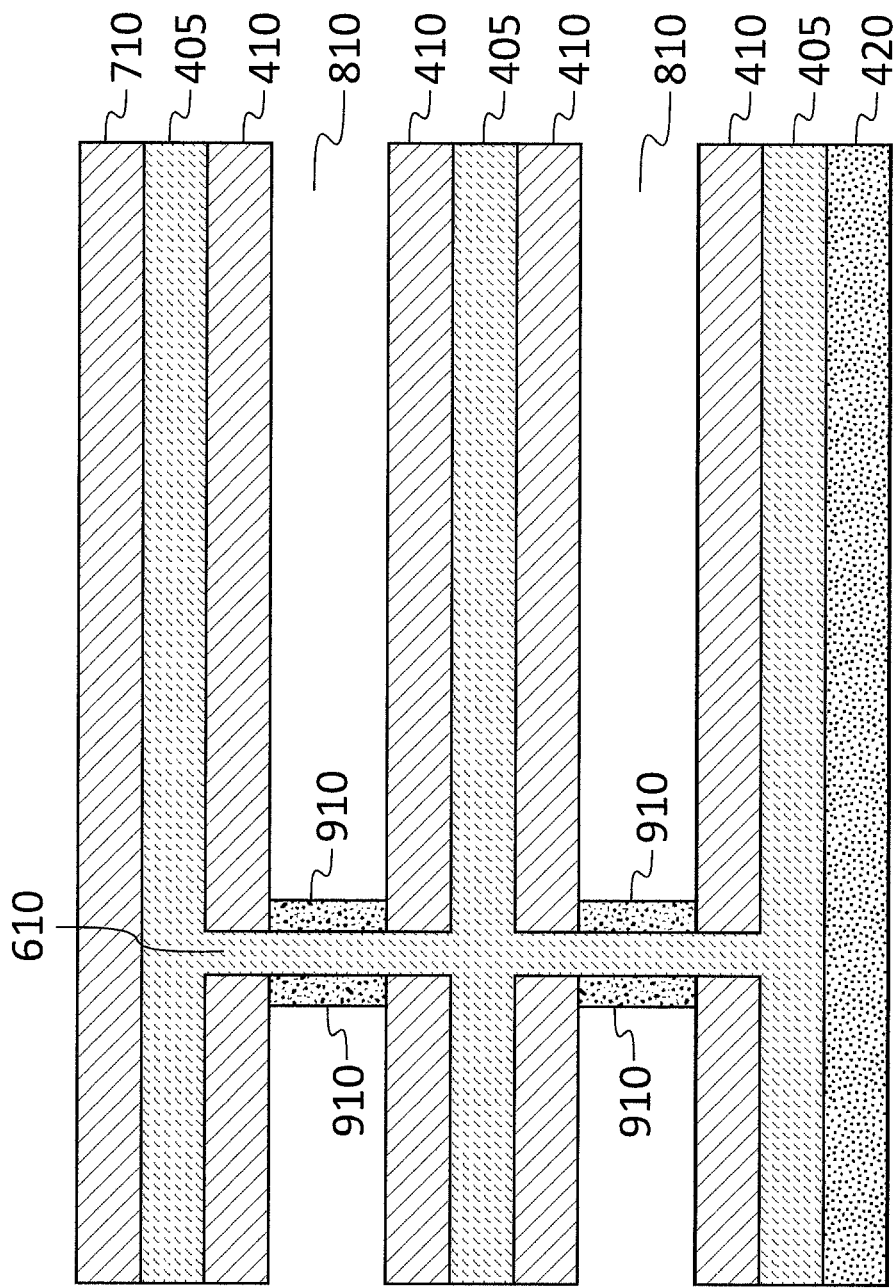
FIG. 9 is an intermediate product in the fabrication process for a neuromorphic device, according to an embodiment of the present invention.

A channel trench 510 may then be etched down to insulating substrate 420, to form the intermediate product illustrated in FIG. 5. A polycrystalline channel 610 (e.g., a polycrystalline silicon channel) may then be grown (e.g., epitaxially grown) in the trench to form the intermediate product illustrated in FIG. 6. The channel may be relatively thick to achieve acceptable aspect ratio. In some embodiments the channel is not expected to be fully depleted, and behaves like a doped planar channel (from an electrostatic standpoint). A capping spacer 710 may then be deposited to form the intermediate product illustrated in FIG. 7. A selective etch may then be used to selectively etch away the sacrificial gate layers 415 leaving gaps 810, to form the intermediate product illustrated in FIG. 8. A thermal oxide layer may then be grown (as a vertical layer, on the channel 610, in each of the gaps) to form the intermediate product illustrated in FIG. 9. In some embodiments, instead of growing a thermal oxide, a gate dielectric is deposited using repeated iterations of an etch-and-fill process, to similar effect.

Figure 10:
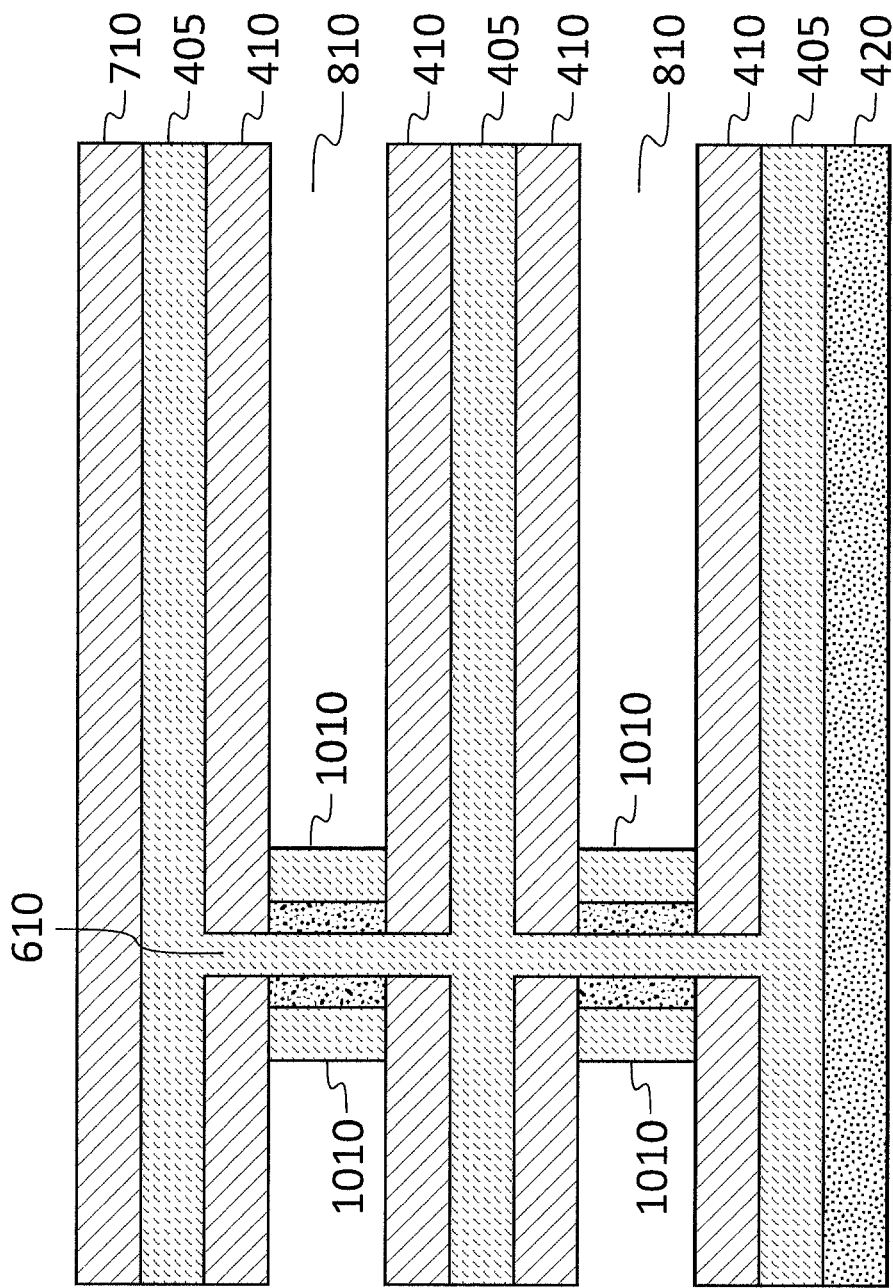
FIG. 10 is an intermediate product in the fabrication process for a neuromorphic device, according to an embodiment of the present invention.
Figure 11:
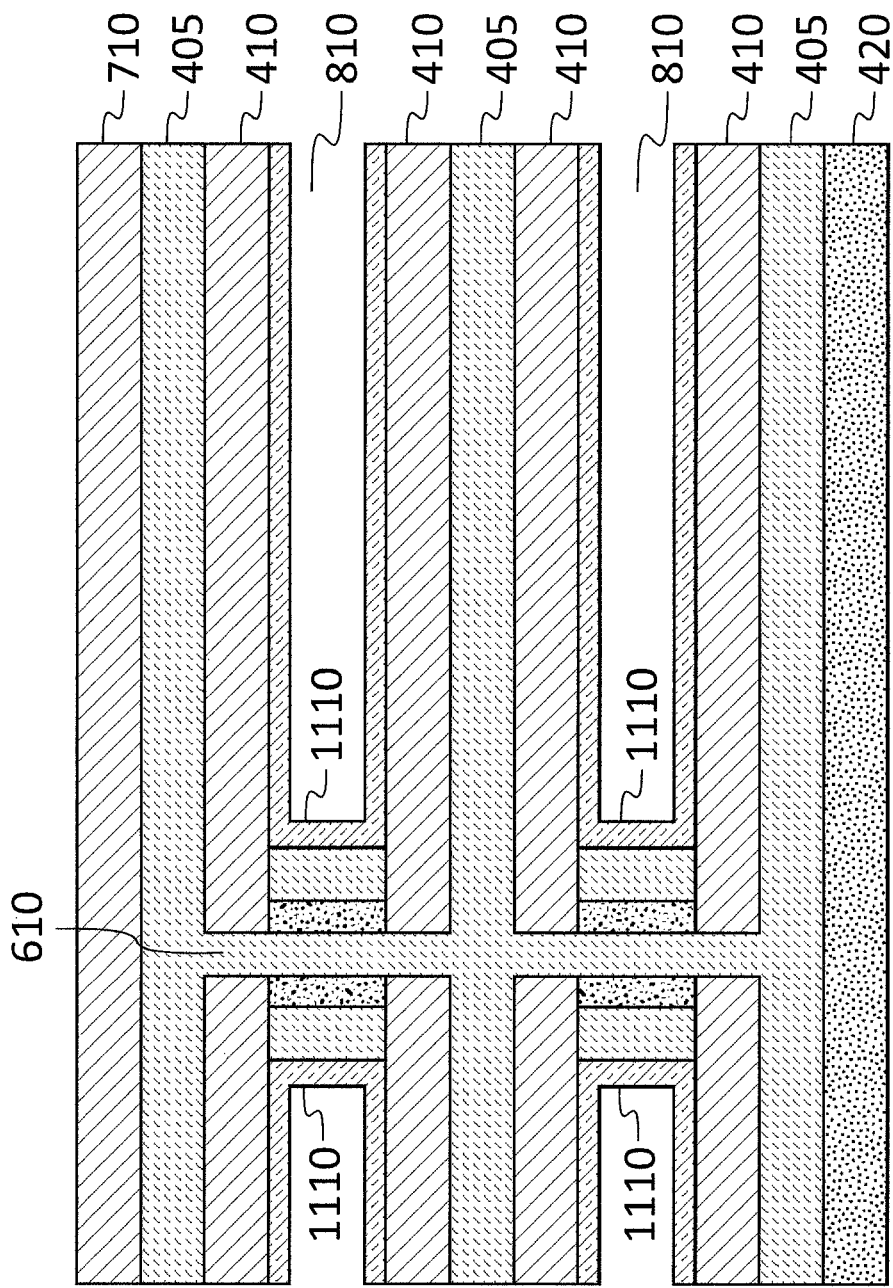
FIG. 11 is an intermediate product in the fabrication process for a neuromorphic device, according to an embodiment of the present invention.
Figure 12:
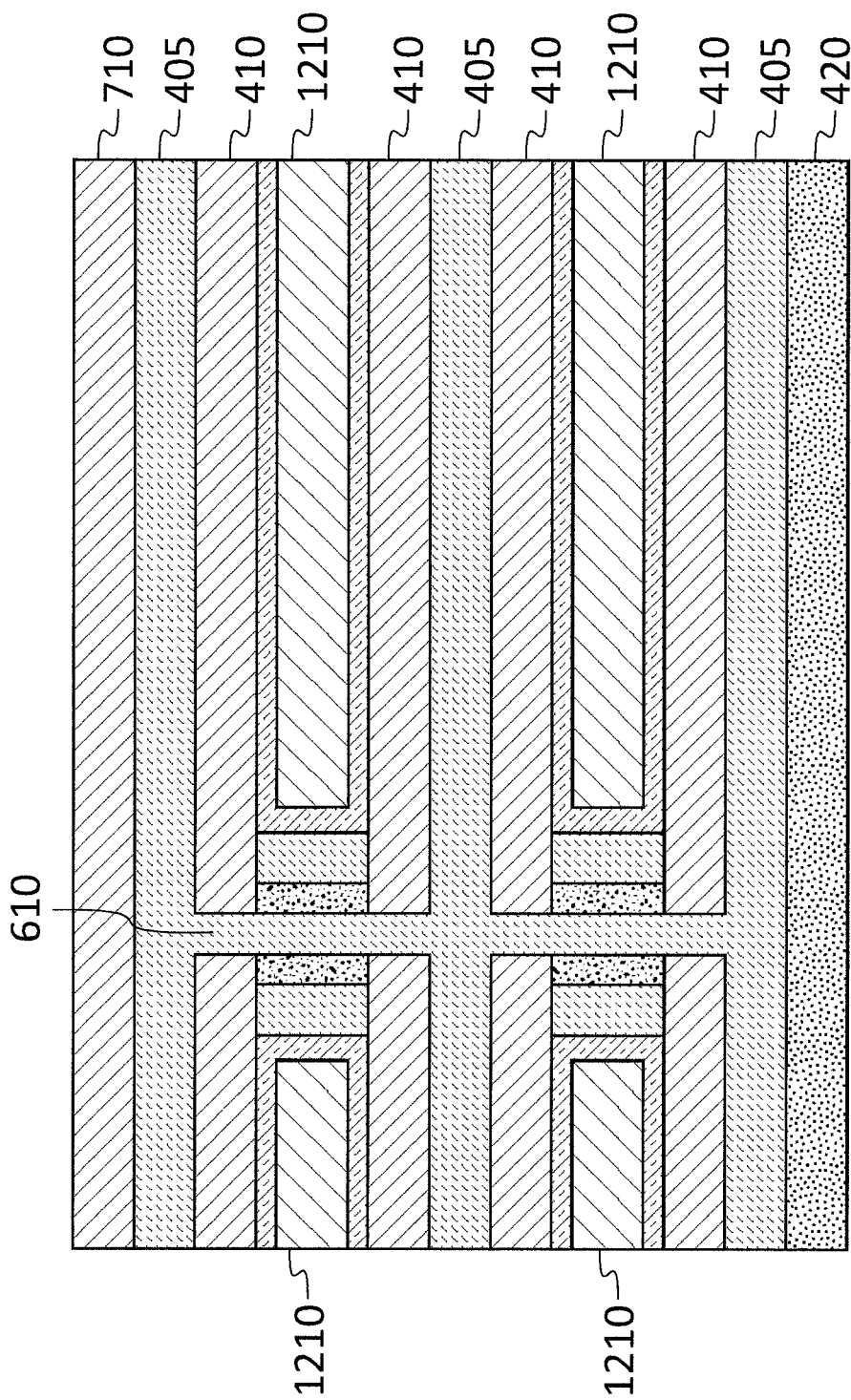
FIG. 12 is an intermediate product in the fabrication process for a neuromorphic device, according to an embodiment of the present invention.

The floating gates 1010 may then be deposited, to form the intermediate product illustrated in FIG. 10. The floating gates 1010 may be composed of polycrystalline silicon (or "poly", or "poly-Si") and they may be formed in repeated iterations of a deposition-etch process (including, e.g., chemical vapor deposition (CVD) processes). Dielectric layers 1110 for insulating the floating gates 1010 from the control gate may then be formed using CVD deposition (or a similar process) of oxynitride (or of another insulator), to form the intermediate product illustrated in FIG. 11. The work function metal may then be deposited using, e.g., atomic layer deposition (ALD), to form the control gates 1210, forming the intermediate product illustrated in FIG. 12.

Figure 13:
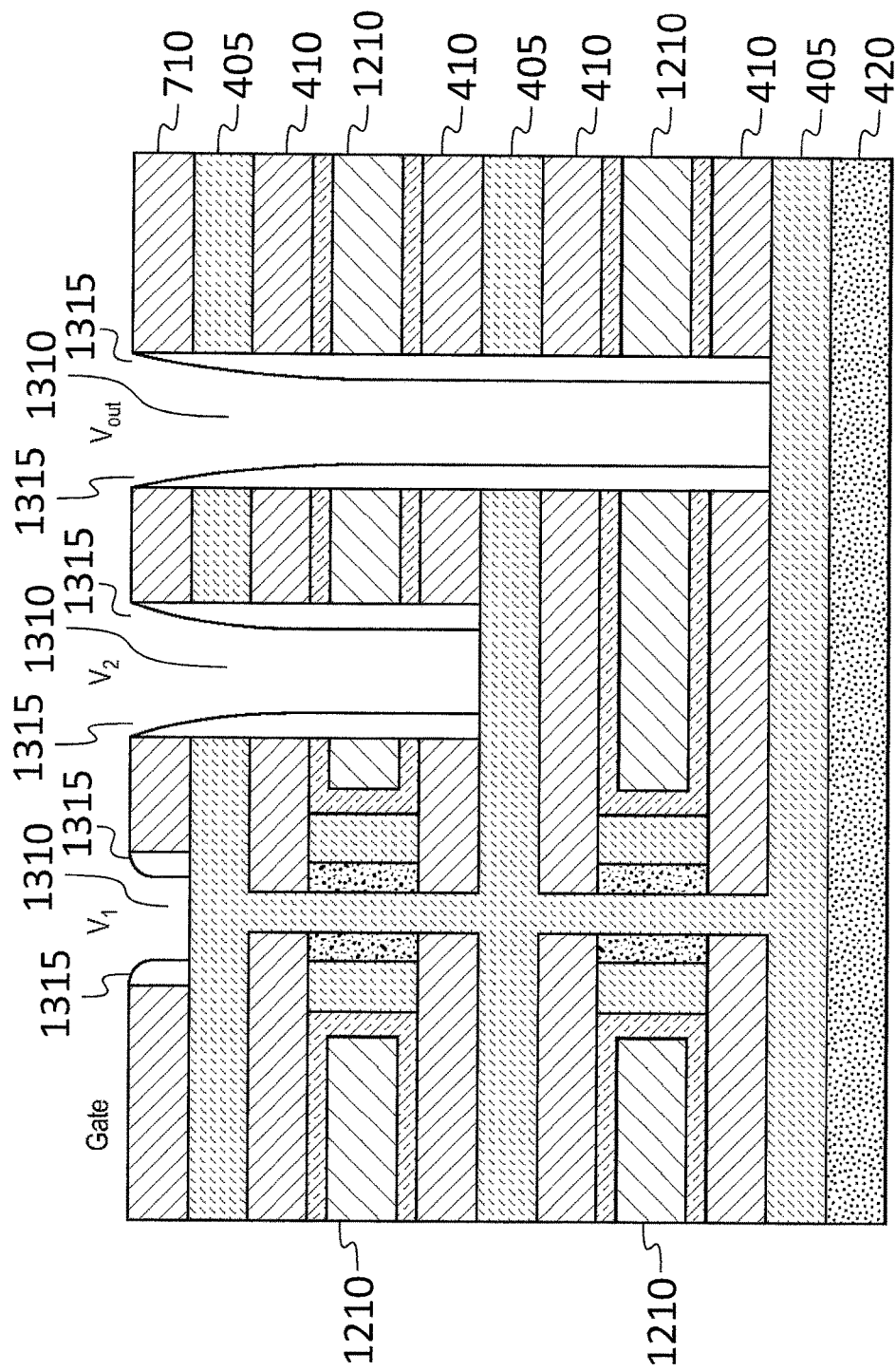
FIG. 13 is an intermediate product in the fabrication process for a neuromorphic device, according to an embodiment of the present invention.
Figure 14:
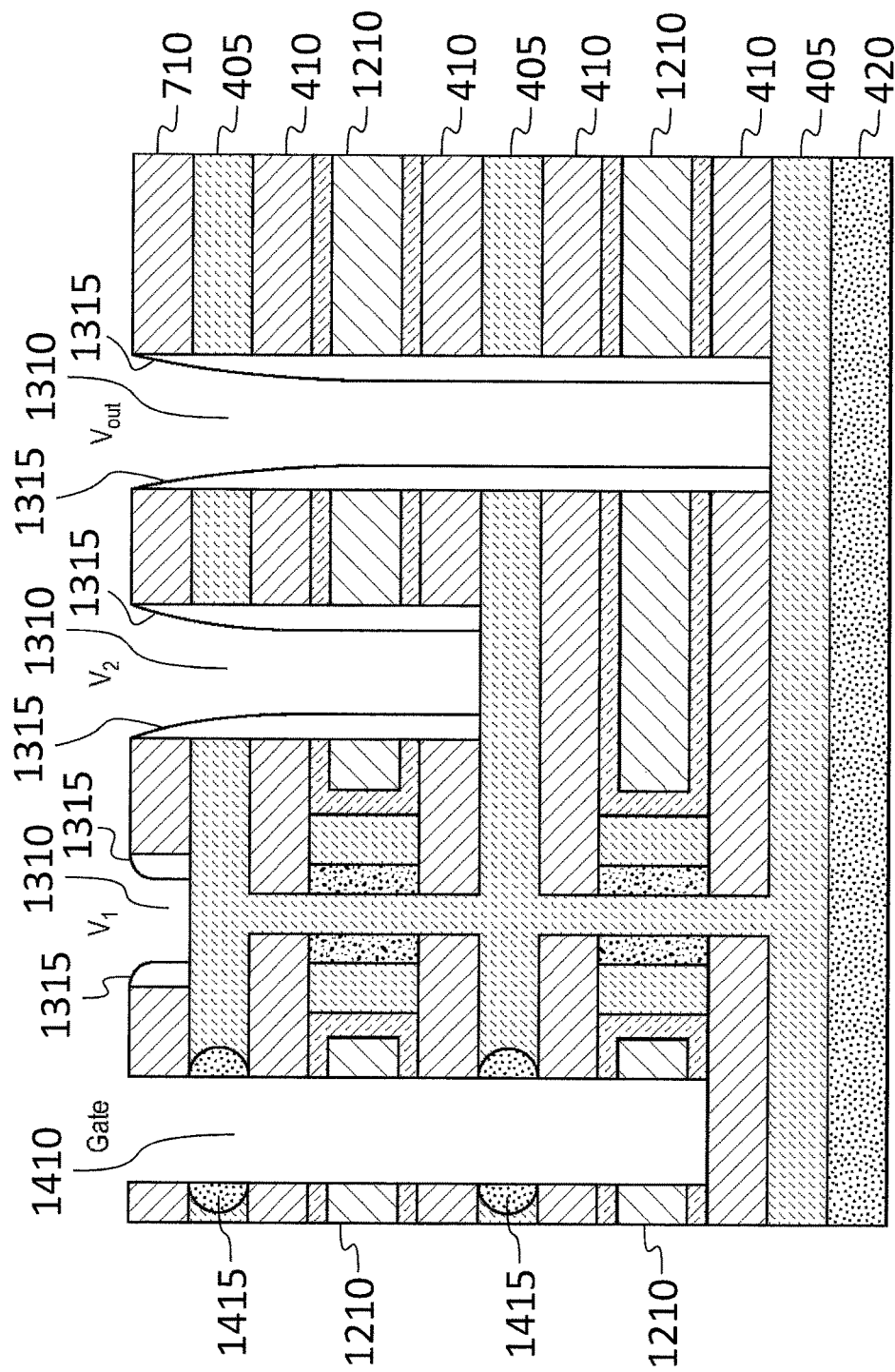
FIG. 14 is an intermediate product in the fabrication process for a neuromorphic device, according to an embodiment of the present invention.

Source-drain contact openings 1310 may then be formed by masking and etching, and oxynitride spacers 1315 may be formed in the source-drain contact openings (e.g., using a related art deposit-etch spacer process), forming the intermediate product illustrated in FIG. 13. All regions of the chip may then be masked except for the region where the gate contact is to be formed (covering, for example, the control gate contact openings) and a control gate contact opening 1410 may be formed by etching. Internal spacers 1415 may then be formed on the silicon regions in the contact opening 1410 (using, e.g., a conventional internal spacer process), and the mask may be removed, to form the intermediate product illustrated in FIG. 14. All contact openings may then be filled with contact metal 1510, to complete the formation of the neuromorphic device, e.g., as illustrated in FIG. 15. The process described above is described for single neuromorphic device; it will be understood that a plurality of like devices may be fabricated concurrently, on a single substrate.

In view of the foregoing, some embodiments provide a neuromorphic device for the analog computation of a linear combination of input signals, for use, for example, in an artificial neuron. The neuromorphic device provides non-volatile programming of the weights, and fast evaluation and programming, and is suitable for fabrication at high density as part of a plurality of neuromorphic devices. The neuromorphic device is implemented as a vertical stack of flash-like cells with a common control gate contact and individually contacted source-drain (SD) regions. The vertical stacking of the cells enables efficient use of layout resources.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower unumerical limitations subsumed therein and any minimum numerical limitation recited in this specification is intended to include all higher numerical limitations subsumed therein.

Although exemplary embodiments of a high-density neuromorphic memory device have been specifically described and illustrated herein, many modifications and variations will be apparent to those skilled in the art. Accordingly, it is to be understood that a high-density neuromorphic memory device constructed according to principles of this invention may be embodied other than as specifically described herein. The invention is also defined in the following claims, and equivalents thereof.

What is claimed is:

1. A neuromorphic device, comprising:
a substrate, the substrate being substantially planar;
a first floating-gate transistor on the substrate, the first floating-gate transistor having:
   a channel;
   a floating gate; and
   a control gate; and
a second floating-gate transistor, vertically stacked on the first floating-gate transistor in a stacking direction, the second floating-gate transistor having:
   a channel;
   a floating gate; and
   a control gate directly connected to the control gate of the first floating-gate transistor,
the neuromorphic device having:
   a gate contact connected to:
      the control gate of the first floating-gate transistor; and
      the control gate of the second floating-gate transistor;
   a first source-drain contact connected to a first end of the channel of the first floating-gate transistor;
   a second source-drain contact connected to a second end, which is opposite the first end, of the channel of the first floating-gate transistor and to a first end of the channel of the second floating-gate transistor; and
   a third source-drain contact connected to a second end of the channel of the second floating-gate transistor,
wherein the second source-drain contact includes a portion extending between the floating gate of the first floating-gate transistor and the floating gate of the second floating-gate transistor such that the floating gate of first floating-gate transistor, the portion of the second source-drain contact, and the floating gate of the second floating-pate transistor overlap with each other in the stacking direction.

2. The neuromorphic device of claim 1, wherein the channel of the first floating-gate transistor and the channel of the second floating-gate transistor are parts of one continuous, vertical structure.

3. The neuromorphic device of claim 1, wherein the neuromorphic device has:
   a first number of floating-gate transistors, including the first floating-gate transistor and the second floating-gate transistor; and
   a second number of source-drain contacts, including the first source-drain contact, the second source-drain contact, and the third source-drain contact,
   the second number being greater than the first number by one.

4. The neuromorphic device of claim 1, comprising sixteen floating-gate transistors including the first floating-gate transistor and the second floating-gate transistor.

5. The neuromorphic device of claim 1, comprising thirty-two floating-gate transistors including the first floating-gate transistor and the second floating-gate transistor.

6. The neuromorphic device of claim 1, wherein:
   the first source-drain contact includes:
      a first conductive path; and
      a second conductive path,
      the first conductive path being horizontal and having a first length, and the second conductive path being vertical and having a second length,
   the second source-drain contact includes:
      a third conductive path; and
      a fourth conductive path,
      the third conductive path being horizontal and having a third length less than the first length, and the fourth conductive path being vertical and having a fourth length less than the second length.

7. The neuromorphic device of claim 1, wherein each of the first source-drain contact and the second source-drain contact comprises a horizontal portion, and the gate contact comprises a vertical portion in a gate contact opening penetrating:
   the horizontal portion of the first source-drain contact; and
   the horizontal portion of the second source-drain contact,
   the neuromorphic device further comprising:
   an internal sidewall spacer in the gate contact opening, to insulate the gate contact from the horizontal portion of the first source-drain contact; and
   an internal sidewall spacer in the gate contact opening, to insulate the gate contact from the horizontal portion of the second source-drain contact.

* * * * *